US007166479B2

(12) United States Patent
Zhu et al.

(10) Patent No.: US 7,166,479 B2
(45) Date of Patent: Jan. 23, 2007

(54) METHODS OF FORMING MAGNETIC SHIELDING FOR A THIN-FILM MEMORY ELEMENT

(75) Inventors: Theodore Zhu, Maple Grove, MN (US); Jeffrey S. Sather, Medina, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/992,984

(22) Filed: Nov. 19, 2004

(65) Prior Publication Data

US 2006/0063278 A1    Mar. 23, 2006

Related U.S. Application Data

(62) Division of application No. 09/318,073, filed on May 25, 1999, now Pat. No. 6,872,993.

(51) Int. Cl.
*H01L 21/00* (2006.01)
(52) U.S. Cl. .............................. 438/3; 438/257; 365/158
(58) Field of Classification Search .................... 438/3, 438/257, 637; 365/158, 173
See application file for complete search history.

(56) References Cited

U.S. PATENT DOCUMENTS

| 3,623,032 A | 11/1971 | Schapira |
| 3,623,035 A | 11/1971 | Kobayashi et al. |
| 3,816,909 A | 6/1974 | Maeda et al. |
| 3,947,831 A | 3/1976 | Kobayashi et al. |
| 4,044,330 A | 8/1977 | Johnson et al. |
| 4,060,794 A | 11/1977 | Feldman et al. |
| 4,158,891 A | 6/1979 | Fisher |
| 4,455,626 A | 6/1984 | Lutes |
| 4,731,757 A | 3/1988 | Daughton et al. |
| 4,780,848 A | 10/1988 | Daughton et al. |
| 4,956,736 A * | 9/1990 | Smith .................. 360/327 |
| 5,039,655 A | 8/1991 | Pisharody |
| 5,064,499 A | 11/1991 | Fryer |

(Continued)

FOREIGN PATENT DOCUMENTS

DE    198 36 567 A    2/2000

(Continued)

OTHER PUBLICATIONS

Kaakani, H. "Non-Volatile Memory (MRAM) ANXXX," [online], Honeywell, Mar. 1999 [retrieved on Nov. 19, 2001]. Retrieved from the Internet: <URL: www.ssec.honeywell.com/avionics/h_gmr.pdf>.

(Continued)

*Primary Examiner*—Phuc T. Dang
(74) *Attorney, Agent, or Firm*—Knobbe Martens Olson & Bear LLP

(57) ABSTRACT

A monolithically formed ferromagnetic thin-film memory is disclosed that has local shielding on at least two sides of selected magnetic storage elements. The local shielding preferably extends along the back and side surfaces of a word line and/or digital lines of a conventional magnetic memory. In this configuration, the local shielding not only may help reduce externally generated EMI, internally generated cross-talk and other unwanted fields in the magnetic bit region, but may also help enhance the desired magnetic fields in the bit region.

20 Claims, 8 Drawing Sheets

U.S. PATENT DOCUMENTS

| | | | |
|---|---|---|---|
| 5,140,549 A | | 8/1992 | Fryer |
| 5,361,226 A | * | 11/1994 | Taguchi et al. ............. 365/171 |
| 5,432,734 A | * | 7/1995 | Kawano et al. ............. 365/158 |
| 5,496,759 A | | 3/1996 | Yue et al. |
| 5,547,599 A | | 8/1996 | Wolfrey et al. |
| 5,569,617 A | | 10/1996 | Yeh et al. |
| 5,587,943 A | | 12/1996 | Torok et al. |
| 5,661,062 A | | 8/1997 | Prinz |
| 5,699,213 A | * | 12/1997 | Ohyama et al. ............. 360/113 |
| 5,741,435 A | | 4/1998 | Beetz, Jr. et al. |
| 5,861,328 A | | 1/1999 | Tehrani et al. |
| 5,902,690 A | | 5/1999 | Tracy et al. |
| 5,940,319 A | | 8/1999 | Durlam et al. |
| 5,956,267 A | * | 9/1999 | Hurst et al. ................. 365/158 |
| 5,976,713 A | * | 11/1999 | Fuke et al. ................. 428/692 |
| 5,986,857 A | * | 11/1999 | Hirano et al. ............... 360/320 |
| 6,048,739 A | | 4/2000 | Hurst et al. |
| 6,165,803 A | | 12/2000 | Chen et al. |
| 6,510,078 B1 | | 1/2003 | Schwarzl |
| 6,580,636 B1 | | 6/2003 | Thewes et al. |
| 2001/0030886 A1 | | 10/2001 | Thewes et al. |
| 2001/0050859 A1 | | 12/2001 | Schwarzl |

FOREIGN PATENT DOCUMENTS

| | | |
|---|---|---|
| JP | 2000 090658 A | 3/2000 |
| WO | WO 00/19440 A | 4/2000 |

OTHER PUBLICATIONS

Lee, Chih-Ling, "A Study of Magnetoresistance Random-Access Memory," date unknown.

Pohm et al., "The Architecture of a High Performance Mass Store with GMR Memory Cells", *IEEE Transactions On Magnetics*, vol. 31, No. 6, Nov. 1995.

Pohm et al., Experimental and Analytical Properties of 0.2 Micron Wide, Multi-Layer, GMR, Memory Elements, *IEEE Transactions On Magnetics.*, vol. 32, No. 5, Sep. 1996.

Prinz, "Magnetoelectronics", Science Magazine, vol. 282, Nov. 27, 1998.

Wang et al., Feasibility of Ultra-Dense Spin-Tunneling Random Access Memory, IEEE Transactions on Magnetics, vol. 33, No. 6, Nov. 1997.

PCT Search Report WO 0072324 A.

* cited by examiner

METHODS OF FORMING MAGNETIC SHIELDING FOR A THIN-FILM MEMORY ELEMENT

RELATED APPLICATION

This application is a divisional of U.S. patent application Ser. No. 09/318,073, filed May 25, 1999, now U.S. Pat. No. 6,872,993, titled "Thin Film Memory Device Having Local And External Magnetic Shielding," the disclosure of which is incorporated by reference herein in its entirety.

CROSS REFERENCE TO CO-PENDING APPLICATIONS

The present application is related to U.S. patent application Ser. No. 08/993,005 filed Dec. 18, 1997, titled "HIGH DENSITY MAGNETIC MEMORY DEVICE AND METHOD OF MANUFACTURE THEREFOR," now U.S. Pat. No. 6,048,739, issued on Apr. 11, 2000; and U.S. patent application Ser. No. 08/993,009, filed Dec. 18, 1997, titled "Self-Aligned Wordline Keeper and Method of Manufacture Therefor," now U.S. Pat. No. 5,956,267, issued on Sep. 21, 1999, which are assigned to the assignee of the present application, the disclosures of which are hereby incorporated by reference in their entireties herein.

GOVERNMENT RIGHTS

This invention was made with Government support under Contract Number N00014-96-C-2114 awarded by NRL (Naval Research Laboratory). The Government has certain rights in this invention.

BACKGROUND OF THE INVENTION

The present invention generally relates to ferromagnetic thin film memory devices and sensors, and more particularly, to shielding for such thin film ferromagnetic memory devices and sensors.

Digital memories of various kinds are used extensively in computer and computer system components, digital processing systems and the like. Such memories can be formed, to considerable advantage, based on the storage of digital bits as alternative states of magnetization of magnetic materials in each memory cell, typically thin-film materials. These films may be thin ferromagnetic films having information stored therein based on the direction of the magnetization occurring in those films. The information is typically obtained either by inductive sensing to determine the magnetization state, or by magneto-resistive sensing of each state.

Such ferromagnetic thin-film memories may be conveniently provided on the surface of a monolithic integrated circuit to thereby provide easy electrical interconnection between the memory cells and the memory operating circuitry on the monolithic integrated circuit. When so provided, it is desirable to reduce the size and increase the packing density of the ferromagnetic thin-film memory cells to achieve a significant density of stored digital bits.

Typically, a thin-film magnetic memory includes a number of sense lines intersected by a number of word lines. At each intersection, a thin film of magnetically coercive material is provided. The magnetic material forms a magnetic memory cell in which a bit of information is stored. A number of digital lines may also be provided. The digital lines typically extend parallel to the sense lines, and are used to initially help rotate the magnetic field vector of the memory cells during, for example, a write operation. This initial rotation of the magnetic field vector increases the torque that can be applied by the word line field during a write operation. Typically, both the digital line and the word line must be asserted to write a corresponding magnetic bit within the memory. Therefore, the digital line can be used to select whether a read or a write operation is performed. For example, when only the word line is asserted, a read operation is performed. When both the word line and digital line are asserted, then a write operation is performed.

A number of competing factors influence the packing density that can be achieved in a typical memory. One factor is the width and thickness of the word lines, and where applicable, digital lines. The dimensions of the word lines and digital lines must typically decrease with increased packing density. Reducing the dimensions of the word lines and digital lines, however, tends to reduce the current that can be accommodated thereby, and thus the magnetic field that can be produced at the corresponding magnetic bit regions.

Another factor is the distance between the word lines and, where applicable, digital lines, and thus the distance between a word line and/or digital line and an adjacent memory cell. Typically, the distance between the word lines and the digital lines must decrease with increased packing density. However, this increases the likelihood that the magnetic field produced by one word line or digital line may adversely affect the information stored in an adjacent memory cell. This adverse interaction is often called cross-talk.

Since a magnetic memory operates with internally generated magnetic fields from word, sense, and digital lines, it is desirable to shield it from externally generated low frequency magnetic fields as well as EMI. One way to reduce the effects of externally generated fields on thin film magnetic memories is to provide a shield in the package that houses the memory. Shielded packages typically have a cavity for receiving the thin-film magnetic memory. A lower shielding layer is provided below the cavity, and an upper shielding layer is provided above the cavity, such as in or on the package lid. The upper and lower shielding layers are often formed from Mu metal or the like. In this configuration, the upper and lower shielding layers may help shunt externally generated fields, limiting their influence on the thin-film magnetic memory.

A limitation of using shielded packages is that the shielding layers may not protect the magnetic bits from internally generated fields, such as those produced by adjacent word or digital lines or the like. Instead, the upper and lower shielding layers of the package may actually increase or concentrate the internally generated fields at the magnetic bit in much the same way as a word line keeper increases or concentrates the magnetic field produced by a word line at the magnetic bit.

U.S. Pat. No. 5,039,655 to Pisharody discloses one approach for reducing internally generated noise, and more particularly, for reducing cross-talk between word lines and adjacent magnetic bits. In Pisharody, a magnetic field keeper formed from a superconductor material is provided around at least three sides of each word line. Pisharody states that the superconductor material shunts the magnetic fields generated by the adjacent word lines, thereby reducing the effects on adjacent memory cells.

A limitation of Pisharody is that only one side of each memory cell has a superconducting magnetic field keeper. Thus, the other side of each memory cell is left completely unprotected from stray fields. As such, magnetic fields that enter the memory from the non-word line side are not suppressed by the superconducting layer. Rather, the superconducting layer may actually increase or concentrate the fields at the magnetic bit regions in much the same way as a word line keeper increases or concentrates the magnetic field produced by a word line at the magnetic bit.

What would be desirable, therefore, is a monolithically formed thin-film magnetic memory that has local shielding on both sides of a magnetic bit to help protect the magnetic bit from external EMI, internally generated cross-talk, and other internally and externally generated noise.

SUMMARY OF THE INVENTION

The present invention overcomes many of the disadvantages of the prior art by providing a monolithically formed ferromagnetic thin-film memory that has local shielding on at least two sides of a magnetic bit region. The local shielding helps protect the magnetic bit from externally generated EMI, internally generated cross-talk, and other internally and externally generated noise. In addition, when the local shielding layers are provided adjacent a word line and/or digital line, the local shielding layers may help concentrate the magnetic fields of the word lines and/or digital lines at the magnetic bit regions, in much the same way as a magnetic field keeper. Accordingly, the shielding layers may not only help reduce undesirable fields from influencing the magnetic bit regions, but may also enhance the desirable magnetic fields at the magnetic bit regions.

In one illustrative embodiment, top and bottom shielding layers are provided above and below a conventional monolithically formed magneto-resistive memory element, although it is contemplated that any type of magnetic memory element may be used. The memory element is preferably formed on the underlayers of a conventional monolithic integrated circuit. This helps provide easy electrical interconnection between the memory cells and the memory operating circuitry on the monolithic integrated circuit. The shielding layers are also preferably monolithically formed.

In another illustrative embodiment, a word line is provided adjacent the memory elements, with a first shielding layer extending adjacent the word line. A second shielding layer is provided adjacent a digital line, which preferably extends along the other side of the memory elements. To help reduce internally generated cross-talk, the first and/or second shielding layers may extend along the side surfaces of the word line and/or digital line, respectively. As indicated above, this may enhance the desired magnetic fields at the memory element and reduce cross-talk.

To fabricate a preferred embodiment of the present invention, a base insulating layer is first provided over the underlayers of a monolithic integrated circuit. A cavity is then formed in the base insulating layer, wherein the cavity has a bottom surface and two spaced side surfaces. A lower shielding layer and a lower barrier layer are provided on the bottom and/or side surfaces of the cavity. A lower conductive material layer is then provided in the cavity and above the soft magnetic material layer and the barrier layer to substantially fill the cavity. The lower conductive material layer forms the word line structure.

A lower insulating layer is then provided over the word line structure. A magnetic bit region is formed on the lower insulating layer. An upper insulating layer is provided over the magnetic bit region. When a digital line is used, a conductive material layer is provided on the upper insulating layer, which is then patterned using conventional patterning techniques. A barrier layer can then be provided, followed by an upper shielding layer. The upper shielding layer may be provided along the top and/or sides of the digital line using conventional processing techniques. When no digital line is desired, the upper shielding layer may be applied directly to the upper insulating layer, if desired.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 4 a cross section of an insulating layer, preferably provided on conventional integrated circuit underlayers;

FIG. 5 is a cross section of the insulating layer of FIG. 4 with a patterned photoresist provided on the top surface thereof;

FIG. 6 is a cross section of the insulating layer of FIG. 5 after a cavity is etched therein, and after the patterned photoresist is removed;

FIG. 7 is a cross section of the insulating layer and cavity of FIG. 6 with the soft magnetic material layer deposited on the bottom surface of the cavity;

FIG. 8 is a cross section of the insulating layer and soft magnetic material layer of FIG. 7 with the conductive material layer deposited thereon;

FIG. 9 is a cross section of the insulating layer, soft magnetic material layer and conductive material layer of FIG. 7 with those portions that are above the top surface of the insulating layer removed;

FIG. 10 is a cross section of the insulating layer, soft magnetic material layer and conductive material layer of FIG. 9 with a thin insulating layer deposited thereon;

FIG. 11 is a cross section of the insulating layer, soft magnetic material layer, conductive material layer and thin insulating layer of FIG. 10 after the magnetic material is deposited and patterned thereon;

FIG. 12 is a cross section of the insulating layer and cavity of FIG. 6 with the soft magnetic material layer deposited on the bottom and side surfaces of the cavity;

FIG. 13 is a cross section of the insulating layer and soft magnetic material layer of FIG. 12 with the conductive material layer deposited thereon;

FIG. 14 is a cross section of the insulating layer, soft magnetic material layer and conductive material layer of FIG. 13 with those portions that are above the top surface of the insulating layer removed;

FIG. 15 is a cross section of the insulating layer, soft magnetic material layer and conductive material layer of FIG. 14 with a thin insulating layer deposited thereon;

FIG. 16 is a cross section of the insulating layer, soft magnetic material layer, conductive material layer and thin insulating layer of FIG. 15 after the magnetic bit region is deposited and patterned thereon;

FIG. 17 is a cross section of the insulating layer, soft magnetic material layer, conductive material layer, thin insulating layer, and magnetic bit region of FIG. 16, with another conductive material layer and another soft magnetic material layer deposited thereon;

FIG. 18 is a cross section of the embodiment of FIG. 17 taken along lines 18—18;

DETAILED DESCRIPTION OF THE PREFERRED EMBODIMENT

Figure 1:
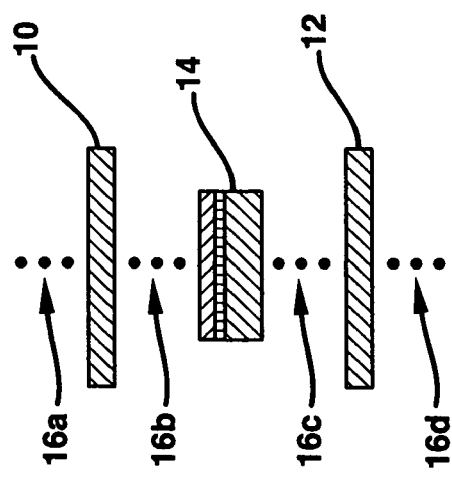
FIG. 1 is a cross section of a monolithically formed memory element having an upper shield and a lower shield.

FIG. 1 is a cross section of a monolithic memory element that has an upper shield and a lower shield. The upper shield 10 is provided above memory element 14, and lower shield 12 is provided below memory element 14. It is contemplated that any type of magnetic memory element 14 may be used.

The memory element 14 is preferably formed above the underlayers of a conventional integrated circuit. This helps provide easy electrical interconnection between the memory cells and the memory operating circuitry on the monolithic integrated circuit. The shielding elements 10 and 12 are also preferably monolithically formed with the integrated circuit and the memory element 14.

The dots at 16b and 16c indicate that one or more layers may be interposed between the memory element 14 and the upper and lower shield elements 10 and 12, respectively. In the embodiment shown, all that is important is that at least two sides, such as the upper and lower sides of the memory element 14, are cladded with two shielding elements 10 and 12. Dots 16a indicate that one or more layers may be provided above the upper shield element 10, and dots 16d indicate that one or more layers may be provided below lower shield 12.

Figure 2:
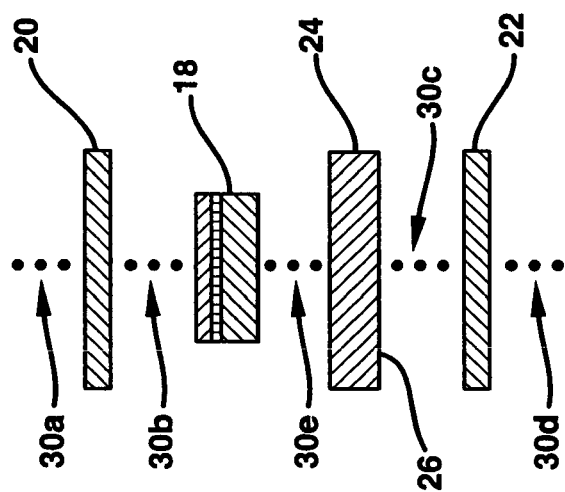
FIG. 2 is a cross section of a monolithically formed memory element having an upper shield and a lower shield, with a word line positioned between the memory element and the lower shield.

To provide a selection mechanism to the memory, a word line may be provided adjacent each memory element. For example, FIG. 2 shows a cross section of a memory element 18 with cladding upper and lower shielding elements 20 and 22, with a word line 24 positioned between the memory element 18 and the lower shield 22. It is recognized that the word line 24 may be positioned between the memory element 18 and the upper shield 20, if desired. The lower shield 22 is preferably positioned adjacent the word line 24 along the side 26 of the word line 24 that is away from the memory element 18.

The dots at 30b indicate that one or more layers may be interposed between the memory element 18 and the upper shield element 20. Likewise, dots 30c indicate that one or more layers may be interposed between the word line 24 and the lower shield element 22. Dots 30a indicate that one or more layers may be provided above the upper shield element 20, and dots 30d indicate that one or more layers may be provided below lower shield 22. Finally, dots 30e indicate that one or more layers may be provided between the word line 24 and the memory element 18.

As indicated above, some memories include a number of digital lines that extend generally parallel to the sense lines, and generally perpendicular to the number of word lines. The digital lines may be used to help initiate rotation of the magnetic field vector of the magnetic element during, for example, a write operation. The initial rotation of the magnetic field vector increases the torque that can be applied by the word line field during a write operation.

Figure 3:
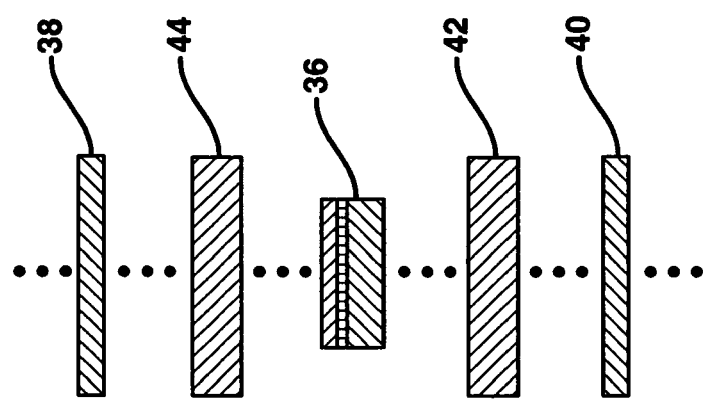
FIG. 3 is a cross section of a monolithically formed memory element having an upper shield and a lower shield, with a word line positioned between the memory element and the lower shield and a digital line positioned between the memory element and the upper shield.

FIG. 3 is a cross section of a memory element 36 with cladding upper and lower shielding elements 38 and 40, with a word line 42 positioned between the memory element 36 and the lower shield 40 and a digital line 44 positioned between the memory element 36 and the upper shield 38. This configuration is only illustrative, and it is contemplated that the word line 42 may be positioned, for example, above the memory element 36, and the digital line 44 may be positioned below the memory element 36.

In this configuration, the local shielding elements 38 and 40 may help protect the memory element 36 from externally generated EMI, and may further help concentrate the magnetic fields produced by the word line 42 and digital line 44 to the memory element 36. Accordingly, the shielding layers may not only help reduce undesirable fields from influencing the magnetic bit regions, but may also help enhance the desired magnetic fields at the memory element 36.

Figure 4:
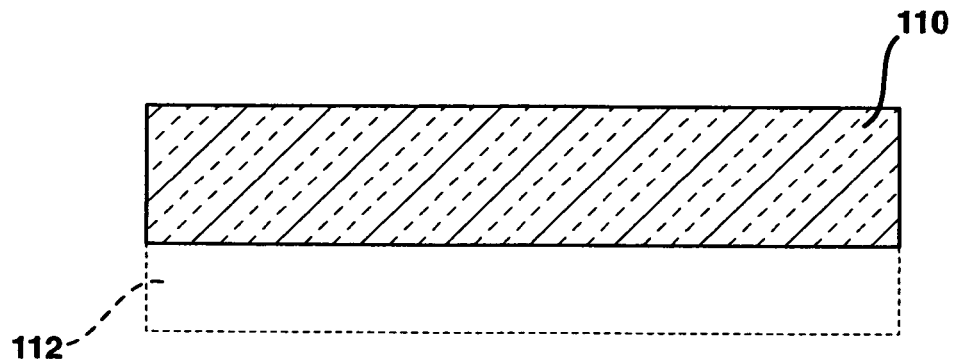
FIGS. 4–18 illustrate a preferred method for forming a monolithic memory element with upper and lower shielding elements.

FIGS. 4–18 illustrate a preferred method for forming an illustrative monolithic memory element with upper and lower shields. FIG. 4 is a cross section of an insulating layer 110 such as silicon nitride or silicon oxide, preferably formed on conventional integrated circuit underlayers 112. The underlayers 112 may include, for example, all circuit layers for a conventional CMOS wafer up to the metal layers. The underlayers 112 are shown using a dashed line, and are not included in the subsequent figures for clarity.

Figure 5:
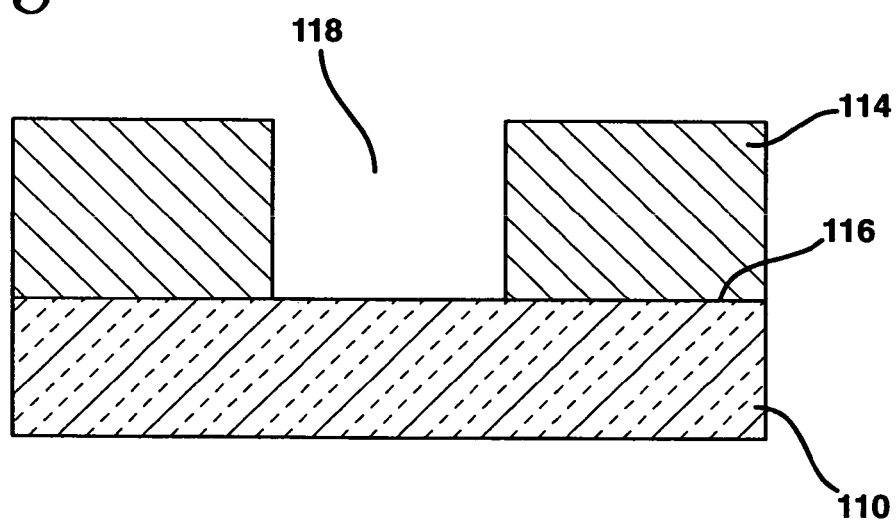
Figure 6:
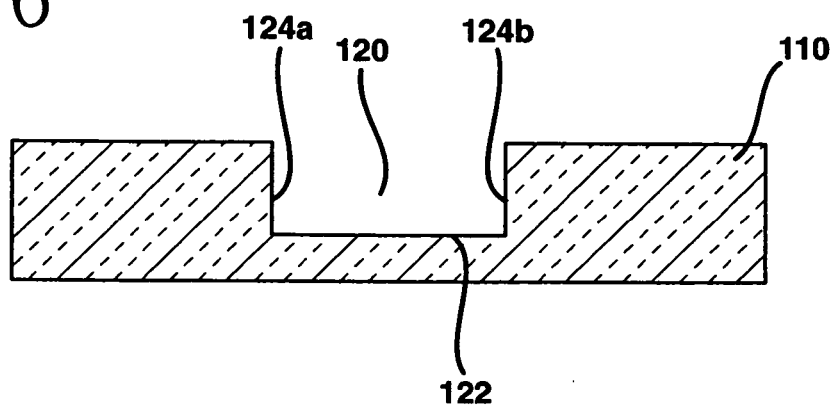

To form a cavity in the insulating layer 110, a photoresist layer 114 is provided on the top surface 116 of the insulating layer 110. The photoresist layer 114 is patterned in a conventional manner to selectively remove a portion 118 of the photoresist layer 114 which overlays the desired cavity, as shown in FIG. 5. The exposed portion of the insulating layer 110 is then etched using a conventional etching process to form cavity 120 as shown in FIG. 6. The cavity 120 has a bottom surface 122 and two spaced side surfaces 124a and 124b. The photoresist is subsequently removed.

Figure 7:
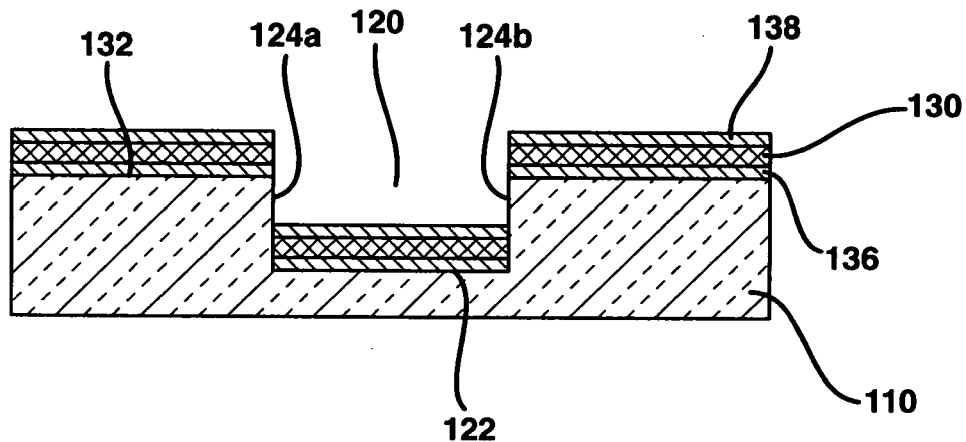

FIG. 7 is a cross section of the insulating layer 110 and cavity 120 of FIG. 6, with a soft magnetic material layer 130 deposited thereon. In the illustrative embodiment, the deposition of the soft magnetic material layer 130 only occurs on the horizontal surfaces of the insulating layer 110, including the bottom surface 122 of the cavity 120, and the remaining top surface 132 of the insulating layer 110. As can be seen, the soft magnetic material layer 130 preferably only partially fills the cavity 120.

The soft magnetic material layer 130 may include a first barrier layer 136, a second barrier layer 138 and a soft magnetic material 130 therebetween. The first and second barrier layers are preferably made from Ta, TiW, TiN, TaN, SiN, SiO$_2$, or similar material. The soft magnetic material is preferably formed from NiFe, NiFeCo, CoFe, or other similar material having soft magnetic properties. It is contemplated that the first barrier layer 136, the second barrier layer 138 and soft magnetic material 130 may be deposited during a single conventional deposition process step, as is known in the art.

Figure 8:
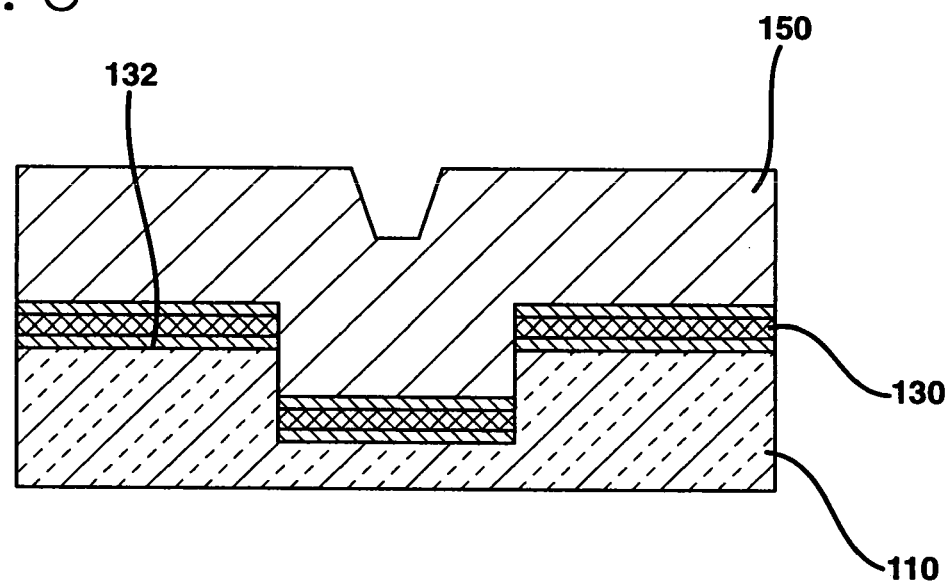

After the soft magnetic material layer 130 is deposited, a conductive material layer 150 is deposited on the top surface of the soft magnetic field layer 130. The conductive material layer 150 is deposited to at least substantially fill the cavity 120, and preferably covers the entire wafer including those portions of the soft magnetic material layer 130 that lie outside of the cavity 120 as shown in FIG. 8. Conductive material layer 150 is preferably formed from Cu or AlCu. As can be seen, the conductive material layer 150 is self-aligned with the soft magnetic field layer 130.

It is contemplated that a number of contacts or vias may be provided between selected underlayers and/or metal lines before and after the conductive material layer 150 is deposited. In one embodiment, each of the contacts/vias are filled with tungsten to reduce the resulting contact/via resistance. It is known that this may require relatively high processing temperatures. However, and in accordance with co-pending U.S. patent application Ser. No. 08/993,009, filed Dec. 18, 1997, and entitled "Self-Aligned Wordline Keeper and Method of Manufacture Therefor", the contact and via processing may be performed before the magnetic materials are provided, thereby preserving the magnetic properties of the magnetic materials.

Figure 9:
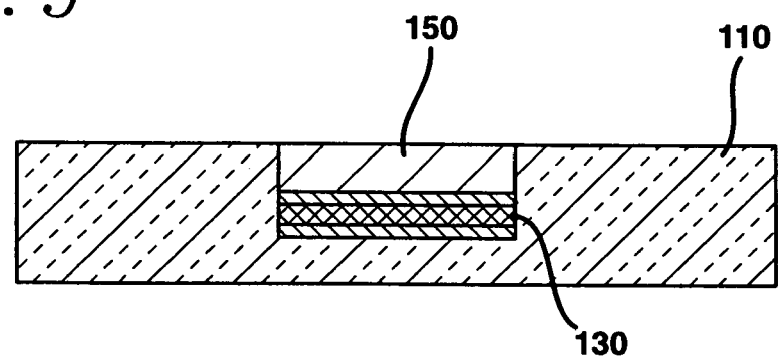

As can be seen, portions of the soft magnetic material layer 130 and conductive material layer 150 may lie above the top surface 132 of the insulating layer 110. In a preferred embodiment, these portions may be removed using a mechanical or chemical-mechanical polishing (CMP) process. FIG. 9 is a cross section showing the insulating layer 110, the soft magnetic material layer 130, and the conductive material layer 150 after the polishing step is completed.

Figure 10:
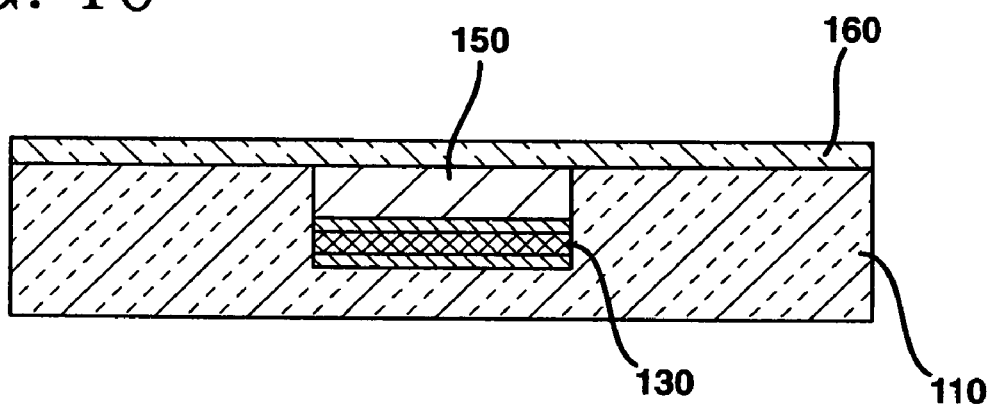

Polishing the top surface of the insulating layer to remove those portions of the soft magnetic material layer 130 and conductive material layer 150 that lie above the top surface of the insulating layer 110 provides a number of advantages. First, a relatively planer top surface is provided. This allows the deposition of a relatively thin insulating layer 160 as shown in FIG. 10, which increases the magnetic field produced by the conductive material layer 150 at bit region 170. Second, the conductive material layer 150 may be made from any type of material since mechanical and chemical-mechanical polishing are typically non-selective. Deposition/photoresist/etch processes typically are limited to the types of metals that can be used.

Figure 11:
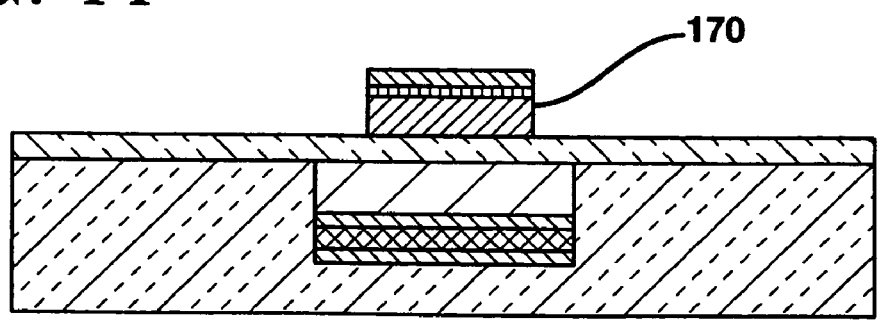

After polishing, a thin insulating layer 160 is preferably provided on the top surface of the insulating layer 110, and over the cavity 120, as shown in FIG. 10. A magnetic bit region 170 may then be deposited and patterned on the thin insulating layer 160 as shown in FIG. 11.

Bit region 170 may be a sandwich-type structure similar to that disclosed in commonly assigned U.S. Pat. No. 4,780,848 to Daughton et al., which is incorporated herein by reference. As further described in Daughton et al., bit region 170 may include a silicon nitride diffusion barrier layer of approximately 300 angstroms. A first layer of a 65% Ni, 15% Fe, and 20% Co Permalloy of 150 angstroms or less is then deposited. Next, a non-magnetic intermediate layer, such as TaN or Cu, is deposited to a thickness of 50 angstroms or less. Then a second layer of a Permalloy is deposited to a thickness of 150 angstroms or less. This is followed by depositing a second non-magnetic resistive layer of tantalum nitride or tantalum to a thickness of 50–1000 angstroms. A capping, or etch stop, layer of Chromium silicon (CrSi) is then deposited to a thickness in the range of 100 to 1500 angstroms. All of the depositions of bit region 170 are preferably done in-situ. The deposition of the Permalloy layers are done in the presence of a bias magnetic field.

Figure 12:
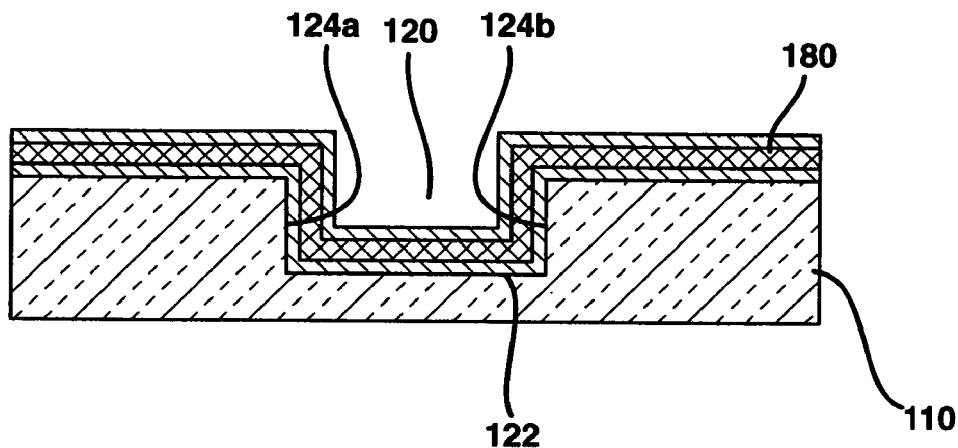
Figure 13:
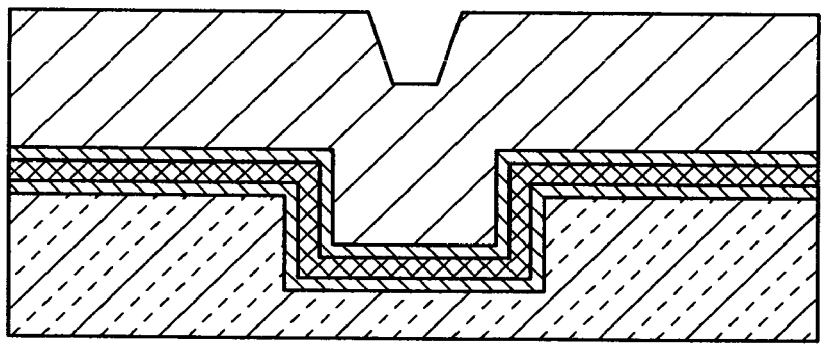
Figure 14:
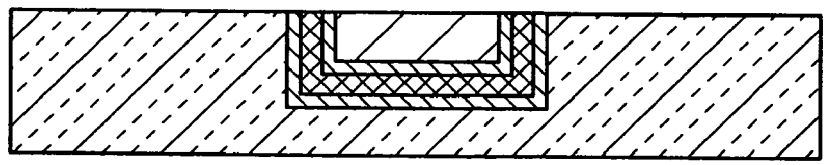
Figure 15:
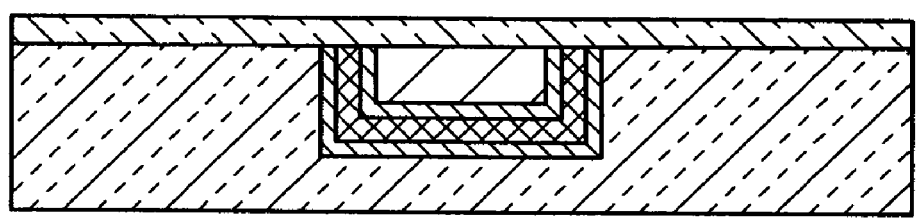
Figure 16:
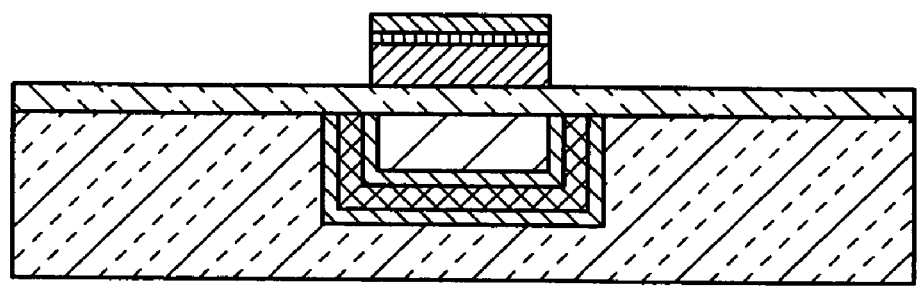

FIG. 12 shows an alternative embodiment of the present invention where the soft magnetic material layer 180 is deposited on the bottom 122 and side surfaces 124a and 124b of the cavity 120. This can be accomplished by using a deposition process that covers both horizontal and vertical surfaces of insulating layer 110, as is known in the art. The remaining fabrication steps shown in FIGS. 13–16 are similar to those described above with reference to FIGS. 8–11, respectively.

The preferred embodiment preferably includes a number of digital lines extending generally perpendicular to the word lines. The digital lines are used to help initiate rotation of the magnetic field vector of the magnetic bit region during, for example, a write operation. This initial rotation of the magnetic field vector increases the torque that can be applied by the word line field during the write operation.

Figure 17:
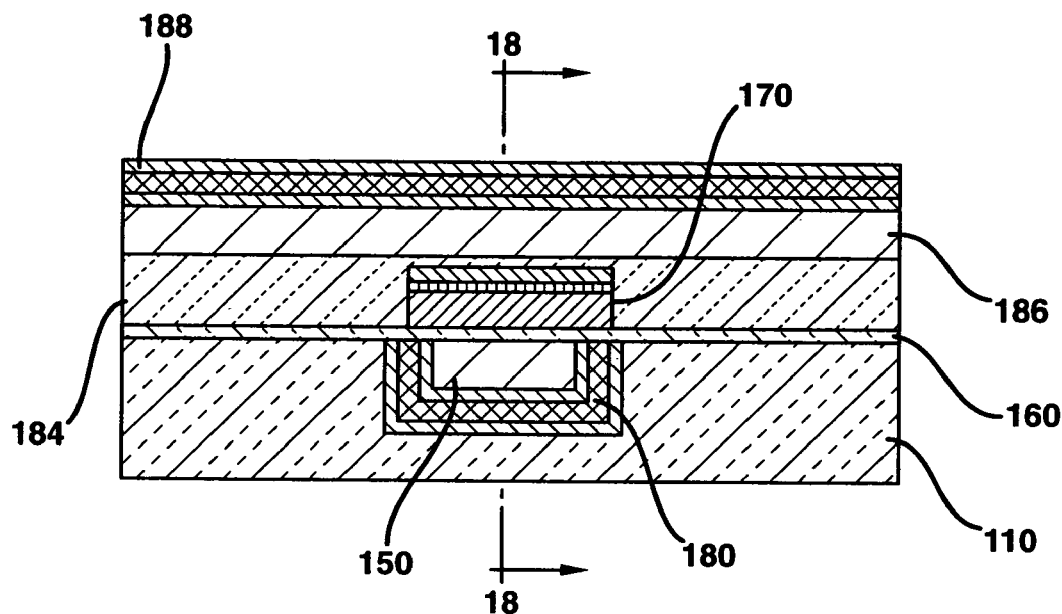

To form the digital line, an insulating layer 184 is first provided over the memory element 170, as shown in FIG. 17. A conductive material layer 186 is then provided on insulating layer 184, which is then patterned using conventional patterning techniques. A shielding element 188 is then provided over the conductive material layer 186. It is contemplated that the shielding element 188 may include one or more barrier layers, as described above.

Figure 18:
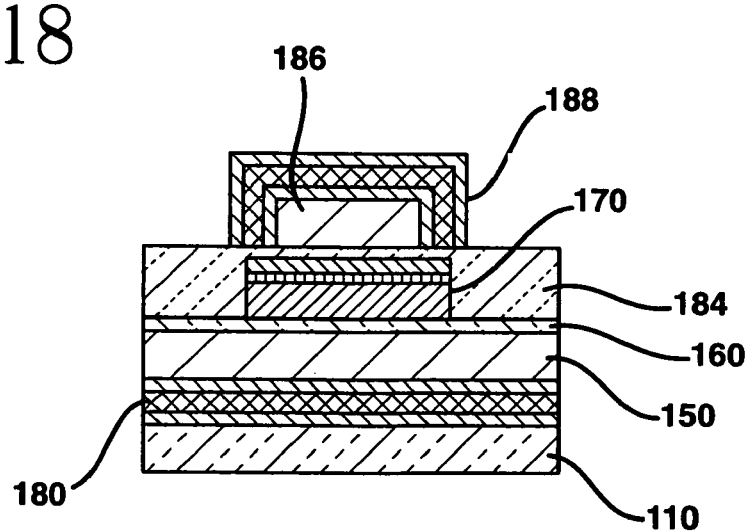

Preferably, the shielding element 186 extends along the top and side walls of the digital line 186, as more clearly shown in FIG. 18. By including the shielding element 186 on the side walls as shown, the effect of the magnetic fields produced by adjacent digital lines on adjacent memory elements may be reduced. If no digital line is desired, shielding element 188 may be applied directly to the upper insulating layer 184.

Figure 19:
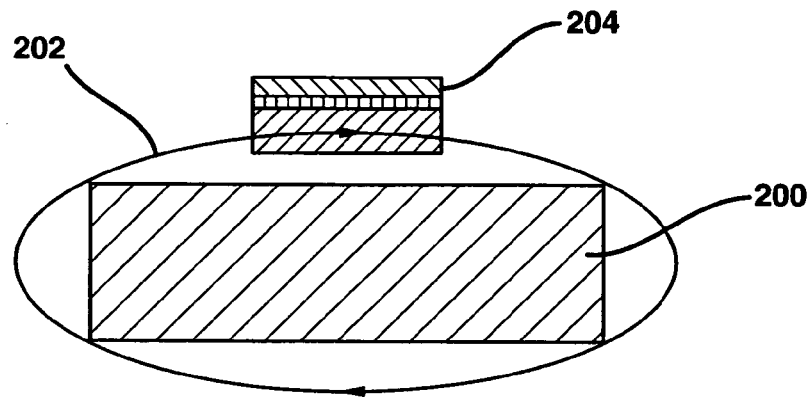
FIG. 19 is a schematic diagram showing an illustrative magnetic field produced by a word line or digital line with no magnetic field keeper.

FIG. 19 is a schematic diagram showing an illustrative magnetic field produced by a word line or digital line 200 with no shield. The word line or digital line 200 is carrying a current into the page to produce a magnetic field 202. The magnetic field 202 is shown extending symmetrically around word line or digital line 200 and intersecting a bit region 204.

Figure 20:
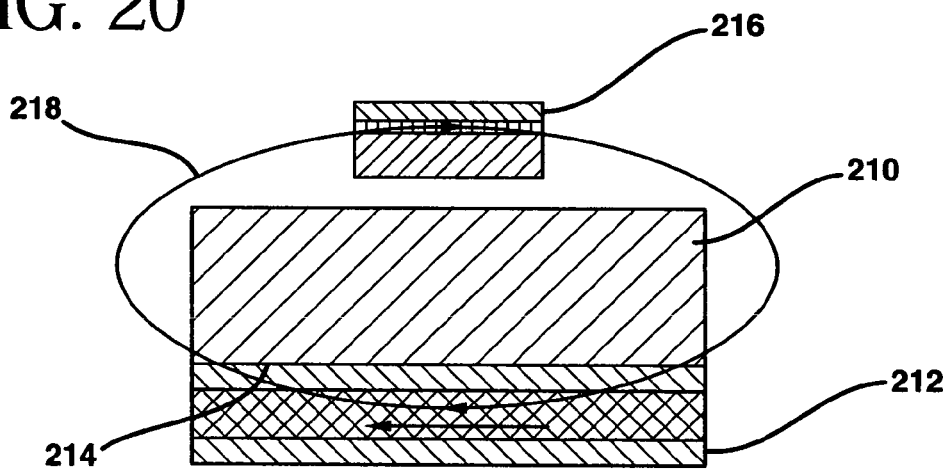
FIG. 20 is a schematic diagram showing an illustrative magnetic field produced by a word line or digital line with a magnetic field keeper extending along one side thereof.

FIG. 20 is a schematic diagram showing an illustrative magnetic field produced by a word line or digital line 210 with a shield 212 adjacent the bottom surface 214 thereof. Upon application of current in the word line or digital line 210, the soft magnetic material in shield 212 aligns as shown, and helps concentrate the magnetic field 218 above the word line or digital line 210. This helps increase the magnetic field 218 at a bit region 216.

Figure 21:
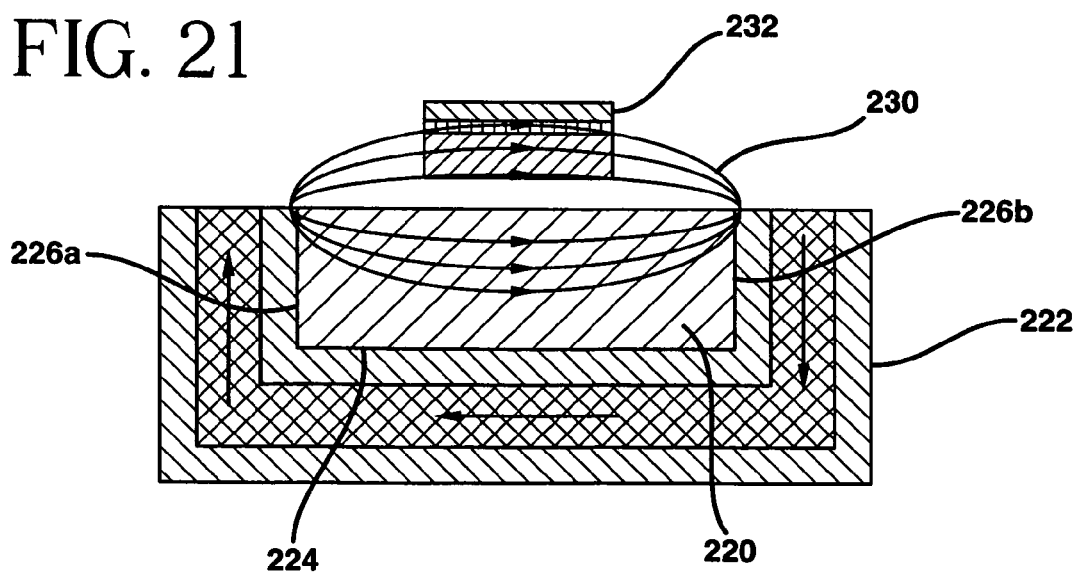
FIG. 21 is a schematic diagram showing an illustrative magnetic field produced by a word line or digital line with a magnetic field keeper extending along the underside and side walls thereof.

FIG. 21 is a schematic diagram showing an illustrative magnetic field produced by a word line or digital line 220 with a magnetic field keeper 222 adjacent the bottom surface 224 and side walls 226a and 226b thereof. Upon application of current in the word line or digital line 220, the soft magnetic material in shield 222 aligns as shown. By providing a shielding element on the side walls 226a and 226b, the magnetic field 230 is even more effectively concentrated adjacent the word line or digital line 220, thereby further increasing the magnetic field 230 at a bit region 232.

In addition to helping concentrate the word line and digital line fields, the shielding elements may help shunt any externally generated fields from reaching the thin-film magnetic memory. This may reduce the sensitivity of the memory elements to external fields, which may increase the reliability of the device.

It is contemplated that the upper and lower shields of the present invention may also be used in conjunction with magnetic field sensor devices. Magnetic field sensor devices often include a magneto-resistive material in the sensor element. Generally, by measuring the resistance change of the magneto-resistive material, the magnitude of the incident magnetic field can be determined. The shielding elements of the present invention may improve the performance of these sensor devices.

In most cases, the magneto-resistive material has edge domains that are magnetized in a particular direction, regardless of whether the incident magnetic field is applied. Under some circumstances, the direction of the magnetization field in one or more of the edge domains can become reversed. This can happen, for example, when the incident magnetic field exceeds a maximum threshold. Under these circumstances, the edge domains typically must be reset before the magnetic field sensor can resume normal operation. The edge domains are typically reset using a reset line that is placed adjacent to the magnetic field sensor. Accordingly, it is contemplated that a reset line of a magnetic field sensor device may include the above-described magnetic shield elements on either side thereof to increase the magnetic field produced by the reset line at the magnetic material of the sensor device, and to reduce the effects of externally generated fields.

Having thus described the preferred embodiments of the present invention, those of skill in the art will readily appreciate that the teachings found herein may be applied to yet other embodiments within the scope of the claims hereto attached.

What is claimed is:

1. A method for monolithically forming a ferromagnetic thin film memory element, comprising:
    forming a lower shielding layer using a soft magnetic material;
    forming a magnetic storage means above the lower shielding layer;
    forming an upper shielding layer using a soft magnetic material above said magnetic storage means; and
    said lower shielding layer, said upper shielding layer and said magnetic storage means all monolithically formed on a common substrate.

2. A method according to claim 1, further comprising forming a first conductive layer between said lower shielding layer and said magnetic storage means.

3. A method according to claim 2, further comprising forming a second conductive layer between said upper shielding layer and said magnetic storage means.

4. A method according to claim 3, further comprising forming a first barrier layer between said lower shielding layer and said first conductive layer.

5. A method according to claim 4, further comprising forming a second barrier layer between said upper shielding layer and said second conductive layer.

6. A method according to claim 3, wherein said first conductive layer functions as a word line.

7. A method according to claim 6, wherein said second conductive layer functions as a digital line.

8. A method of forming a ferromagnetic thin film memory element having an upper magnetic field shield and a lower magnetic field shield, the method comprising:
    providing an insulating layer;
    forming a cavity in said insulating layer, wherein the cavity has a bottom surface and two spaced side surfaces;
    providing a first soft magnetic material layer above the bottom surface of the cavity, thereby partially filling the cavity;
    providing a first conductive layer in the cavity and above the first soft magnetic material layer to at least substantially fill the cavity;
    providing a first insulating layer over the first conductive material layer;
    forming a magneto-resistive bit region above said first insulating layer;
    providing a second insulating layer above said magneto-resistive bit region;
    providing a second conductive material layer above the second insulating layer; and
    providing a second soft magnetic material layer above the upper surface of the second conductive material layer.

9. A method according to claim 8, wherein said first soft magnetic material layer is provided on both the bottom surface and at least part of the side surfaces of the cavity.

10. A method according to claim 8, wherein said second conductive material layer has an upper surface, a lower surface, and two spaced side surfaces, wherein the second soft magnetic material layer substantially covers the upper surface and the two spaced side surfaces of the second conductive material layer.

11. A method according to claim 8, further comprising providing a first barrier layer on said first soft magnetic layer before providing said first conductive layer in the cavity.

12. A method according to claim 11, further comprising providing a second barrier layer on the upper surface of the second conductive material layer before providing said second soft magnetic material layer.

13. A method for monolithically forming a ferromagnetic thin film memory element, comprising:
    forming a first magnetic shielding layer;
    forming a first barrier layer above the first magnetic shielding layer;
    forming a first conductive layer above the first magnetic shielding layer such that the first barrier layer is disposed between the first magnetic shielding layer and the first conductive layer;
    forming a magnetic storage cell above the first conductive layer such that the first conductive layer is disposed between the first magnetic shielding layer and the magnetic storage cell;
    forming a second conductive layer above the magnetic storage cell such that the magnetic storage cell is disposed between the first conductive layer and the second conductive layer;
    forming a second barrier layer above the second conductive layer such that the second conductive layer is disposed between the magnetic storage cell and the second barrier layer; and
    forming a second magnetic shielding layer above the second conductive layer such that the second barrier layer is disposed between the second conductive layer and the second magnetic shielding layer.

14. The method as defined in claim 13, further comprising forming the first barrier layer from tantalum (Ta).

15. The method as defined in claim 13, further comprising forming the first barrier layer from titanium-tungsten (TiW).

16. The method as defined in claim 13, further comprising forming the first barrier layer from titanium-nitride (TiN).

17. The method as defined in claim 13, further comprising forming the first barrier layer from tantalum nitride (TaN).

18. The method as defined in claim 13, further comprising forming the first barrier layer from silicon nitride (SiN).

19. The method as defined in claim 13, further comprising forming the first barrier layer from silicon dioxide ($SiO_2$).

20. The method as defined in claim 13, further comprising forming the first magnetic shielding layer from NiFe, NiFeCo, or CoFe.

* * * * *